United States Patent [19]
Dubin

[11] Patent Number: 5,971,506
[45] Date of Patent: *Oct. 26, 1999

[54] SYSTEM FOR RACK MOUNTING A DESK-TOP COMPUTER

[75] Inventor: Israel Dubin, Sugar Land, Tex.

[73] Assignee: Texas Microsystems, Inc., Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/927,452

[22] Filed: Sep. 11, 1997

Related U.S. Application Data

[63] Continuation of application No. 08/635,040, Apr. 17, 1996, abandoned, which is a continuation of application No. 08/377,780, Jan. 24, 1995, abandoned.

[51] Int. Cl.⁶ .................................................. A47B 81/00
[52] U.S. Cl. .................. 312/223.2; 312/323; 312/334.8; 361/683; 361/725; 361/726; 361/727
[58] Field of Search .............................. 312/223.1, 223.2, 312/223.6, 323, 334.8; 361/683, 725, 726, 727

[56] References Cited

U.S. PATENT DOCUMENTS

| | | | |
|---|---|---|---|
| 2,630,364 | 3/1953 | Gleason | 312/323 |
| 2,809,086 | 10/1957 | Fall | 312/323 |
| 2,823,973 | 2/1958 | De Vere Carver et al. | 312/323 |
| 3,133,768 | 5/1964 | Klakovich | 312/323 X |
| 4,331,369 | 5/1982 | Lazar et al. | 312/334.8 X |
| 4,602,829 | 7/1986 | De Andrea | 312/223.1 |
| 5,121,296 | 6/1992 | Hsu | 361/725 X |
| 5,136,468 | 8/1992 | Wong et al. | 361/725 X |
| 5,169,221 | 12/1992 | Wheeler | 312/323 |
| 5,172,305 | 12/1992 | De Wilde | 361/725 X |
| 5,269,598 | 12/1993 | Liu | 361/725 X |
| 5,301,346 | 4/1994 | Notarianni et al. | 361/727 X |
| 5,351,176 | 9/1994 | Smith et al. | 361/681 |
| 5,398,161 | 3/1995 | Roy | 361/727 |
| 5,424,910 | 6/1995 | Lees | 361/727 X |
| 5,460,441 | 10/1995 | Hastings et al. | 361/683 X |
| 5,626,406 | 5/1997 | Schmid | 312/334.8 X |
| 5,871,264 | 2/1999 | Ohara | 312/223.2 X |

OTHER PUBLICATIONS

Drawing of Model CC3000 Slide by General Devices *Date Not Provided.

*Primary Examiner*—Peter M. Cuomo
*Assistant Examiner*—Rodney B. White
*Attorney, Agent, or Firm*—Vinson & Elkins L.L.P.

[57] ABSTRACT

A system and method for converting a desk-top computer into a rack-mounted computer includes mounting the chassis of a desk-top computer in a carrier tray. The carrier is then mounted in means for sliding the carrier in and out of an electrical equipment rack.

20 Claims, 5 Drawing Sheets

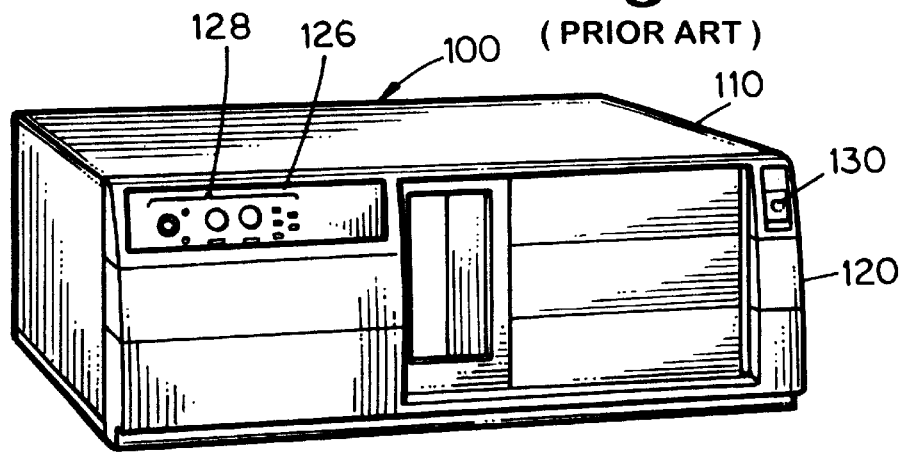
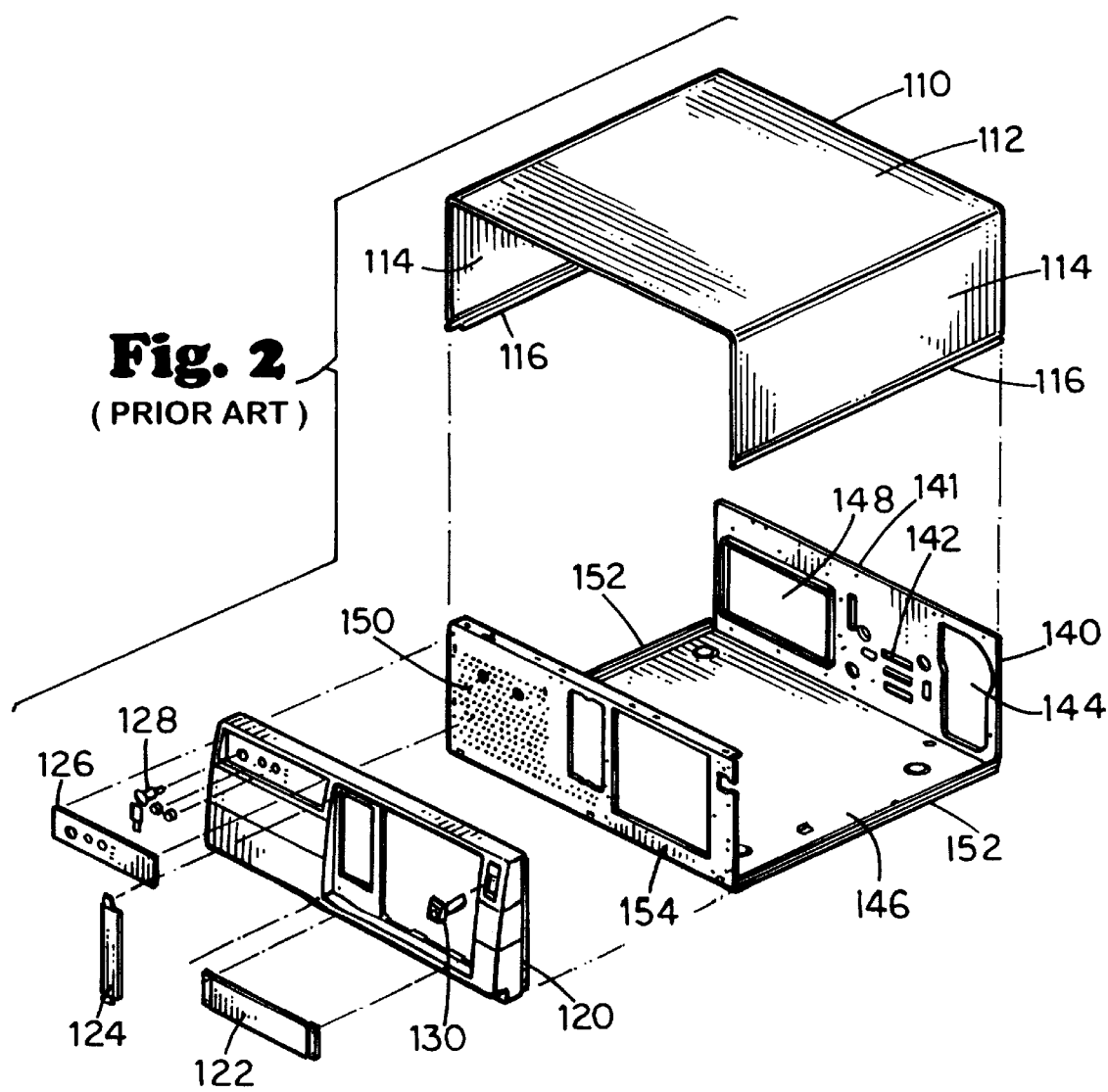

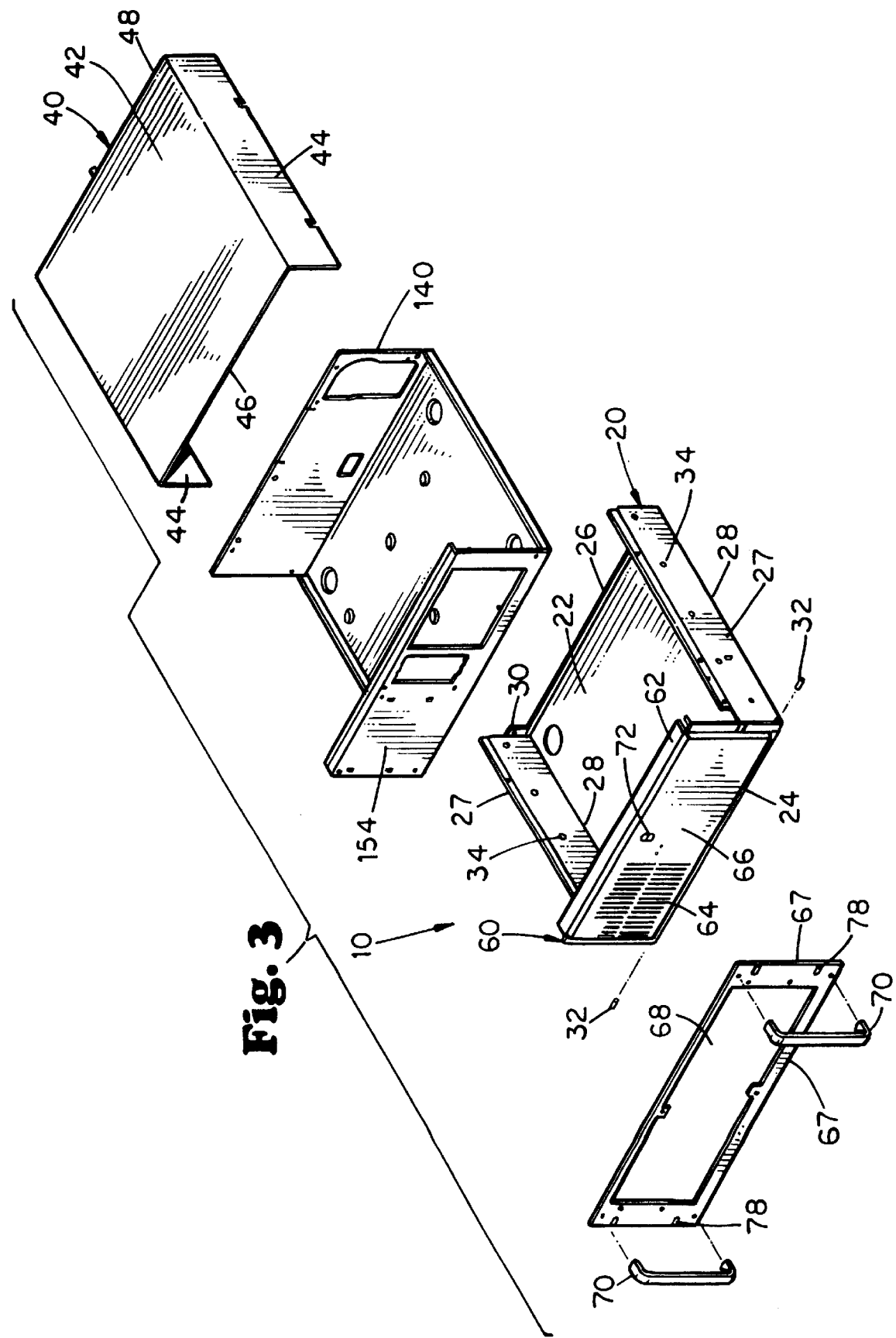

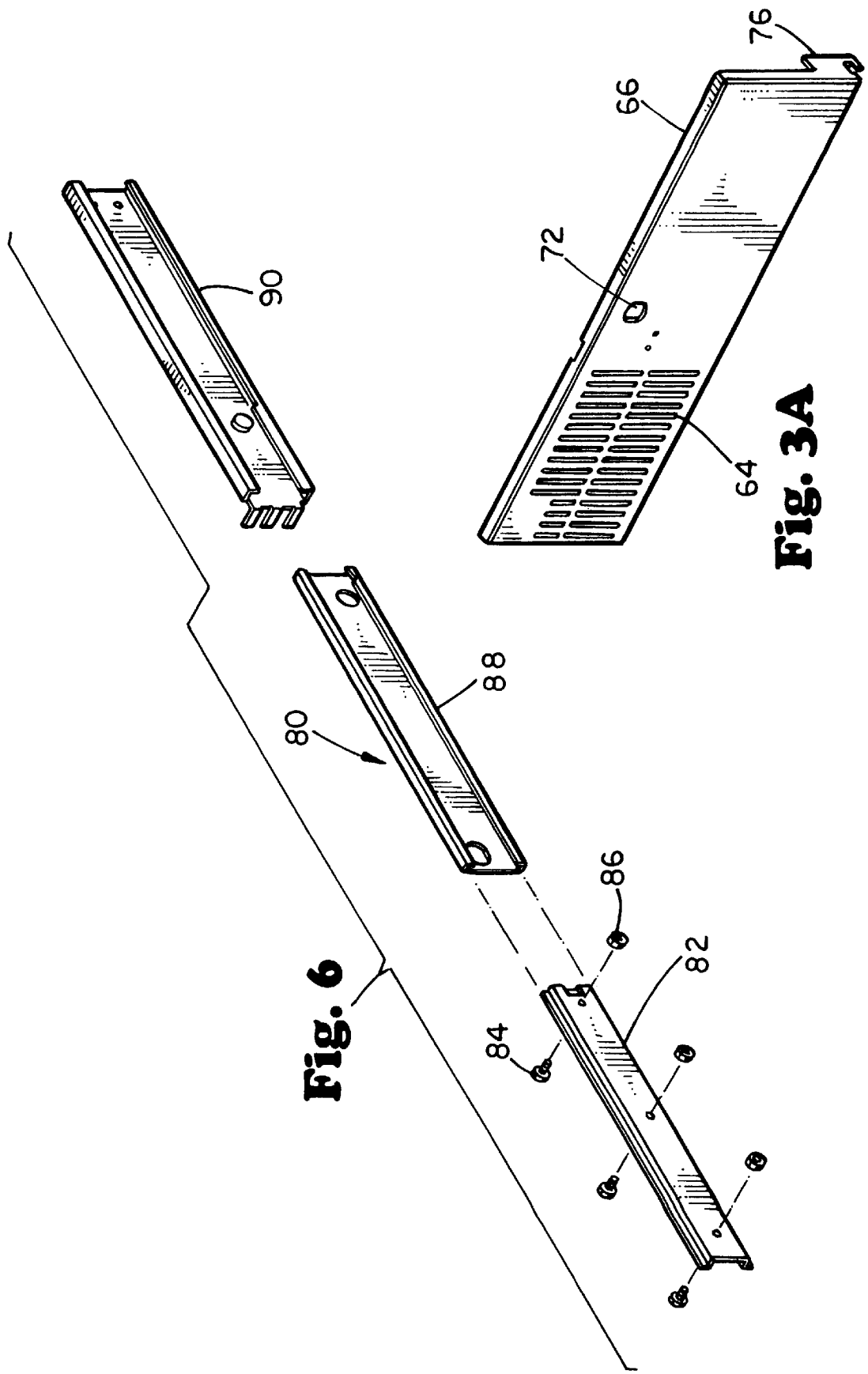

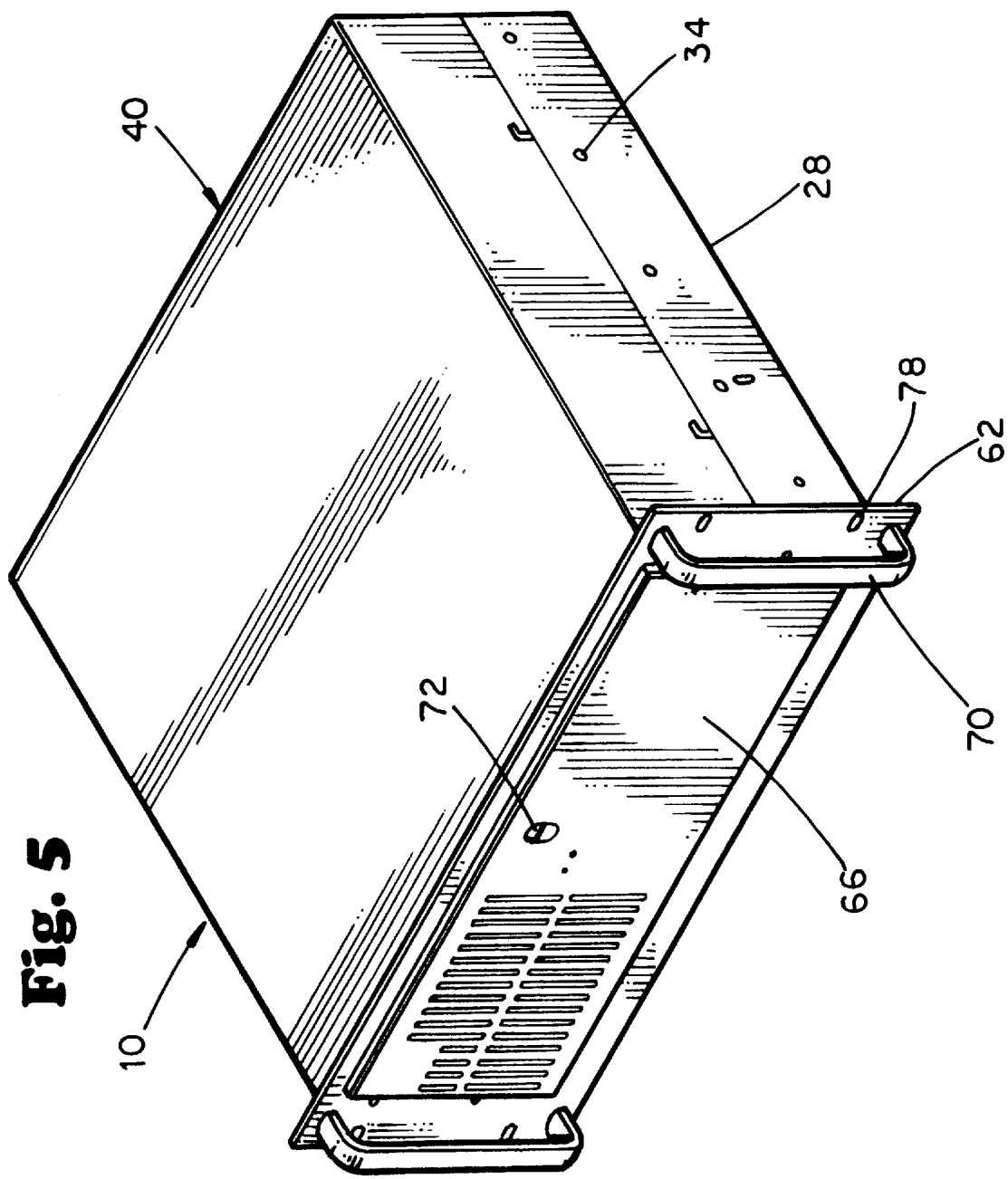

SYSTEM FOR RACK MOUNTING A DESK-TOP COMPUTER

This application is a continuation of application Ser. No. 08/635,040, filed Apr. 17, 1996, now abandoned, which was a continuation of application Ser. No. 08/377,780, filed Jan. 24, 1995, now abandoned.

BACKGROUND

The present invention pertains to a mounting system for a desk-top computer; more particularly, the present invention pertains to a system for mounting a desk-top computer in an electrical equipment rack.

In recent years, the explosion in the use of desk-top computers has placed these units in a wide variety of locations to include laboratories and repair shops. In such laboratories and repair shops electrical equipment such as oscilloscopes and power supplies are often mounted in racks. These racks are designed with standard size openings for the insertion of various types of electrical equipment. Desk top computers, however, are not readily inserted into electrical equipment racks because of the way that desk-top computers are packaged and sold by manufacturers.

Typically, the disk drives, circuit boards and power supply within a desk-top computer are enclosed in a factory installed protective cover and have a factory installed face plate or bezel on the front of the desk-top computer which provides a decorative appearance for the user. In the face plate are normally holes or slots for disk drives and one or more openings for lights and switches which respectively control or indicate the operation of the computer.

When it becomes necessary to use a desk-top computer in conjunction with other components typically mounted in electrical equipment racks, users have either placed the entire desk-top computer with its cover and face plate in place in another container and inserted the combination in a rack. Still other users have drilled holes in the top or sides of the factory installed cover and used the cover for the desk-top computer as a mounting bracket. Other users never confront the problem and merely place the desk-top computer on a shelf in the electrical equipment rack.

The three foregoing systems for placing commonly available desk-top computers in electrical equipment racks all have their drawbacks in that they do not provide for easy access to the inner portion of the desk-top computer to either service or upgrade the desk-top computer. Therefore, when it becomes necessary to service the desk-top computer or to add more memory or additional computing ability, it is necessary to disassemble the entire computer or remove the computer with its cover and face plate from the rack before any access can be gained to the interior of the computer. Such actions are difficult and time-consuming.

There is, therefore, a need in the art to provide an easy method and system for mounting a desk-top computer in an electrical equipment rack which provides for easy accessibility to the inside of the computer. Such system should not require any modification to the electrical components or to the component mounting chassis of the desk-top computer.

SUMMARY OF THE INVENTION

An easy method and system for mounting a desk top computer in an electrical equipment rack is provided by the present invention.

Utilization of the system of the present invention for converting a desk-top computer into one that can be mounted in a rack with other electrical equipment includes first removing the factory installed cover from the component mounting chassis of the desk-top computer. Second, the factory installed face plate is removed from the desk-top computer. Once the removal of the cover and the face plate has been completed, the chassis of the computer is mounted in the carrier tray of the present invention. This carrier tray includes a horizontal base, two sides which project vertically upwardly from the edges of the horizontal base and a front plate assembly which projects vertically upwardly from the front edge of the horizontal base. The front plate assembly also includes a face plate which fits into a standard opening an electrical equipment rack. Additionally, a protective cover which mates with the carrier tray is utilized to protect the chassis and electrical components of the desk-top computer.

BRIEF DESCRIPTION OF THE FIGURES

A better understanding of the system and method of the present invention for converting a desk-top computer into one that can be mounted in an electrical equipment rack with other electrical equipment may be had by reference to the drawings wherein:

FIG. 1 is a perspective view of a prior art computer showing its cover and face plate;

FIG. 2 is an exploded view of a prior art computer;

FIG. 3 is an exploded view of the desk-top computer mounting system of the present invention;

FIG. 3A is a perspective view of the optional tilt-down front cover;

FIG. 5 is a completely assembled mounting system; and

FIG. 6 is a perspective view of a typical telescoping slide assembly.

DESCRIPTION OF THE EMBODIMENTS

Figure 4:
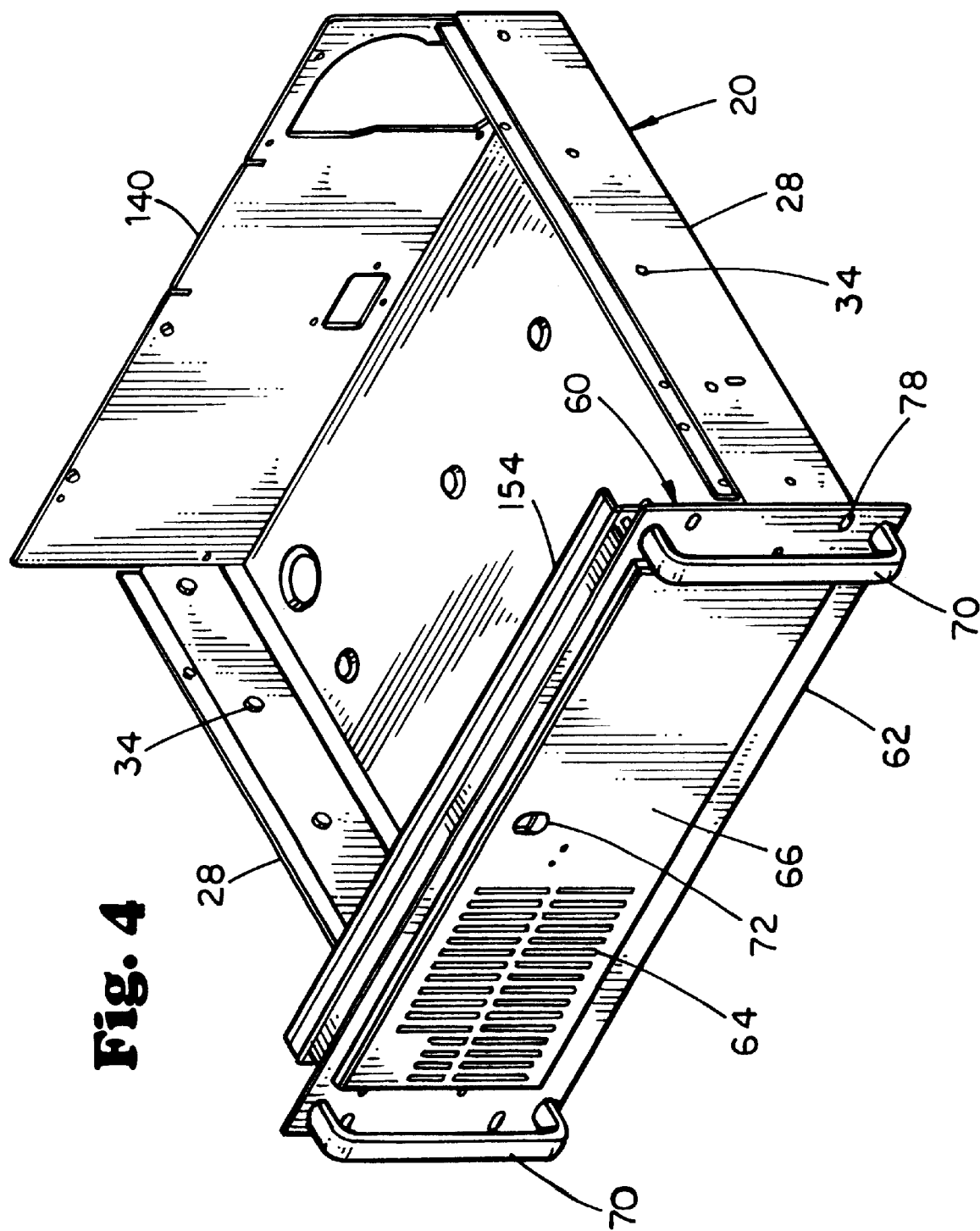
FIG. 4 is a partially assembled mounting system.

In FIG. 1 a prior art computer 100 is shown. Clearly visible is the cover 110, the front plate or bezel 120, the switches and lights for controlling and monitoring computer operation 128, the power button 130 and the label piece 126 which identifies the switches and lights.

In FIG. 2, the prior art computer 100 is shown in its exploded configuration. The cover 110 is shown above the chassis 140 which mounts the electrical hardware of the computer and the face plate 120, which provides a decorative appearance for the user. On the face plate 120 are mounted a horizontal disk drive cover 122, and a vertical disk drive cover 124.

The cover 110 typically has a top 112, two sides 114 and a groove or rail 116 to engage the chassis 140. The chassis 140 has a bottom 146, a back plate 141 containing openings 142 for connecting cords, an opening 144 for power and exit air, and an opening 148 for access to vertically mounted circuit boards. Opposite the back plate 141 is a front plate 154 which contains a plurality of air flow openings 150. On either side of the bottom 146 are rails or projections 152 to engage the compatible mounting portions 116 on the sides 114 of the cover 110.

To utilize the desk-top computer mounting system 10 of the present invention, the face plate 120 and cover 110 are removed from the computer 100 and either stored or discarded.

The chassis 140, with it electrical components, is then surrounded by the mounting system 10 of the present invention. As shown in FIGS. 3, 4 and 5, the carrier tray 20 is the heart of the present invention. At the front of the carrier tray 20 is the front face assembly 60. Covering the carrier tray 20 is the protective cover 40.

The carrier tray 20, consists of a horizontal base 22 having two side edges 28, a front edge 24 and a back edge 26. Projecting upwardly from the side edges 28 are substantially vertical sides 27. Projecting upwardly from the front edge 24 is the front face assembly 60 which includes a substantially vertical front plate 62. As may be seen in the preferred embodiment, the front face assembly 60 also includes a tilt-out door 66 which is hingedly connected to carrier tray 20 by two hollow pins 32 secured by screws.

As shown in FIG. 3A, the tilt-out door 66 includes a series of slots 64 to allow for the passage of air for cooling of the electrical components of the computer and a pair of ears 76 on either side which, in conjunction with the pins 32, provide for the hinged mounting of the tilt-out door 66. If desired a lock may be inserted through hole 72 to secure the face of the computer.

Further enabling the desk-top computer mounting system 10 of the present invention to be compatible with electrical equipment rack mounting is the face plate 67, which is affixed to the front plate 62 of the carrier tray 20 which holds the computer chassis 140. The perimeter of the face plate 67 fits within a standard opening of a rack-mounting system for electrical equipment. The holes 78 allow for the utilization of fasteners to secure the computer mounting system 10 to the electrical equipment rack. The opening 68 allows both access to the face of the computer and room for the tilt-out door 66 to swing down. Optionally, the face plate 67 may provide for the mounting of handles 70 for pulling the entire computer and its mounting system out of a rack.

Over the carrier tray 20 is a protective cover 40 which is often required by regulation or product codes to both protect the users from the high currents generated in a computer and the computer components from damage. The protective cover 40 has a horizontal surface 42, two sides 44, a front edge 46 and a back edge 48.

In FIG. 4 the chassis 140 is shown mounted in the carrier tray 20. A pair of tabs 30 on either side of the carrier tray 20 (FIG. 3) may be used in conjunction with a fastener to affix the chassis 140 to the carrier tray 20. If required other mounting tabs may be placed at convenient locations. A plurality of holes 34 are formed in substantially vertical sides 27 of the carrier tray 20. These holes are used to mount means for sliding the computer, while in the carrier tray 20, in and out of the electrical equipment mounting rack. Typical of such slide means is the telescoping slide assembly 80 shown in FIG. 6.

The telescoping slide assembly 80 shown in FIG. 6 includes a mounting section 82 which mounts to the sides 27 of the carrier tray 20 by inserting a plurality of fasteners 84 through the mounting section 82 and the holes 34 in the sides 27 and securing the fasteners 84 with nuts 86 or threads within holes 34. Attached to the electrical equipment rack is a fixed mounting piece 90. Connecting the mounting section 82 to the fixed mounting piece 90 is an intermediate section 88.

The complete assembled system 10 of the present invention is shown in FIG. 5. Protective cover 40 may be mechanically affixed to the sides 27 of the carrier tray 20 by a variety of means well known to those of ordinary skill in the art.

It will be understood by those of ordinary skill in the art that while the system and method for mounting a desk-top computer in an electrical equipment rack of the present invention has been disclosed by reference to the specific embodiment depicted in the figures and described above, those of ordinary skill in the art will understand that numerous modifications and deviations may be made to the disclosed embodiment without departing from the scope of the present invention. Such scope is to be described by the appended claims.

I claim:

1. A system for converting a computer designed and constructed for desk-top applications into an electrical equipment rack-mounted computer, said desk-top computer including a unitary component chassis upon which electrical components are mounted, and wherein said desktop computer further includes a removable unitary cover assembly having a top surface and two side surfaces, said system comprising:

a separate carrier tray constructed and arranged to support, contain and provide a single-level mounting for the unitary component chassis of the desk-top computer upon removal of said unitary cover assembly; and means for slidably mounting said separate carrier tray in the electrical equipment rack.

2. The system as defined in claim 1 wherein said means for slidably mounting said separate carrier tray in the electrical equipment rack are telescoping slides affixed to said separate carrier tray.

3. The system as defined in claim 1 further including a face plate constructed and arranged to match a standard size opening in the electrical equipment rack.

4. The system as defined in claim 1 further including a door hingedly mounted to said separate carrier tray.

5. The system as defined in claim 1 further including a cover constructed and arranged to fit over said separate carrier tray.

6. An electrical equipment rack-mounted computer comprising:

a computer including electrical components mounted on a unitary component chassis, said computer having a removable unitary cover assembly having a top surface and two side surfaces;

a separate carrier tray constructed and arranged to provide a single-level mounting for said unitary component chassis upon removal of said unitary cover assembly;

said separate carrier tray including a substantially horizontal base, a substantially vertical front plate, and two substantially vertical sides;

means for mounting said separate carrier tray in an electrical equipment rack.

7. The electrical equipment rack-mounted computer as defined in claim 6 wherein said means for slidably mounting said separate carrier tray in an electrical equipment rack are telescoping slides affixed to each of said two substantially vertical sides.

8. The electrical equipment rack-mounted computer as defined in claim 6 further including a face plate constructed and arranged to match a standard size opening in an electrical equipment rack, said face plate being attached to said substantially vertical front plate.

9. The electrical equipment rack-mounted computer as defined in claim 6 further including a door hingedly mounted to said separate carrier tray.

10. The electrical equipment rack-mounted computer as defined in claim 6 further including the cover constructed and arranged to interact with said separate carrier tray to enclose said computer and attach to said two substantially vertical sides.

11. A slide mounting arrangement for a unitary computer chassis comprising:
- a separate carrier tray constructed and arranged to support, contain and provide a single-level mounting for the unitary computer chassis;
- said separate carrier tray including a substantially horizontal base, a substantially vertical front plate, and two substantially vertical sides;
- means for slidably mounting said separate carrier tray in a rack.

12. The slide mounting arrangement as defined in claim 11 wherein said substantially horizontal base has a front edge, a back edge and two side edges wherein said two substantially vertical sides project substantially vertically upwardly from said side edges; and
- said substantially vertical front plate projects vertically upward from said front edge of said substantially horizontal base.

13. The slide mounting arrangement as defined in claim 12 wherein a face plate is attached to said front plate.

14. A slide mounting arrangement as defined in claim 13 further including a security door hingedly affixed to said separate carrier tray and constructed and arranged to cover a portion of said face plate.

15. The slide mounting arrangement as defined in claim 11 further including a cover constructed and arranged to mate with said substantially vertical sides of said separate carrier tray.

16. A system for rack-mounting a desk-top computer, said system comprising:
- a computer designed and constructed for desk-top applications having a removable unitary component chassis on which electrical components are mounted and also having a removable unitary cover assembly with a top surface and two side surfaces projecting downwardly therefrom;
- a separate carrier tray constructed and arranged to support, contain and provide a single-level mounting for the unitary component chassis of the desk-top computer upon removal of said unitary cover assembly; and
- means for slidably mounting said separate carrier tray in the electrical equipment rack.

17. The system as defined in claim 16 wherein said means for slidably mounting said separate carrier tray in the electrical equipment rack are telescoping slides affixed to said separate carrier tray.

18. The system as defined in claim 16 further including a face plate constructed and arranged to match a standard size opening in the electrical equipment rack.

19. The system as defined in claim 16 further including a door hingedly mounted to said separate carrier tray.

20. The system as defined in claim 16 further including a cover constructed and arranged to fit over said separate carrier tray.

\* \* \* \* \*